(12) United States Patent
Fujii

(10) Patent No.: US 10,914,638 B2
(45) Date of Patent: Feb. 9, 2021

(54) PYROELECTRIC SENSOR

(71) Applicant: FUJIFILM Corporation, Tokyo (JP)

(72) Inventor: Takamichi Fujii, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/566,643

(22) Filed: Sep. 10, 2019

(65) Prior Publication Data

US 2020/0003627 A1    Jan. 2, 2020

Related U.S. Application Data

(63) Continuation of application No. PCT/JP2017/046480, filed on Dec. 25, 2017.

(30) Foreign Application Priority Data

Mar. 17, 2017    (JP) ................. 2017-052936

(51) Int. Cl.
     *G01J 5/34*         (2006.01)
     *G01J 1/04*         (2006.01)
     *G01J 5/08*         (2006.01)
     *H01L 41/187*     (2006.01)

(52) U.S. Cl.
CPC ............... *G01J 5/34* (2013.01); *G01J 1/0407* (2013.01); *G01J 5/0862* (2013.01); *H01L 41/1876* (2013.01)

(58) Field of Classification Search
CPC .......... G01J 5/34; G01J 1/0407; G01J 5/0862; G01J 5/046; H01L 41/1876
See application file for complete search history.

(56) References Cited

U.S. PATENT DOCUMENTS

| 4,704,534 A | 11/1987 | Turnbull |
| 5,446,285 A | 8/1995 | Choi |
| 5,583,058 A | 12/1996 | Utsumi et al. |

(Continued)

FOREIGN PATENT DOCUMENTS

| EP | 2 555 269 A1 | 2/2013 |
| GB | 2 173 038 A | 10/1986 |

(Continued)

OTHER PUBLICATIONS

The extended European search report issued by the European Patent Office dated Mar. 13, 2020, which corresponds to European Patent Application No. 17901283.6-1020 and is related to U.S. Appl. No. 16/566,643.

(Continued)

*Primary Examiner* — David P Porta
*Assistant Examiner* — Meenakshi S Sahu
(74) *Attorney, Agent, or Firm* — Studebaker & Brackett PC

(57) ABSTRACT

Provided is a pyroelectric sensor including: an Si substrate; a laminated portion in which a heat absorption layer formed of an inorganic material, a lower electrode, a piezoelectric film, and an upper electrode are laminated in this order from one surface side of the Si substrate on the one surface; and an optical filter that is provided at a position of the other surface of the Si substrate corresponding to the laminated portion and selectively transmits an infrared ray, in which an infrared ray incident to the laminated portion from the optical filter side through the Si substrate is sensed.

10 Claims, 4 Drawing Sheets

(56) References Cited

U.S. PATENT DOCUMENTS

| | | |
|---|---|---|
| 2001/0035559 A1 | 11/2001 | Ando et al. |
| 2013/0023063 A1 | 1/2013 | Matsushima et al. |
| 2013/0099122 A1* | 4/2013 | Park ............... G01J 5/44 250/340 |
| 2013/0228454 A1 | 9/2013 | Mawatari |
| 2014/0299770 A1 | 10/2014 | Giebeler |
| 2014/0339427 A1 | 11/2014 | Noda et al. |
| 2015/0028444 A1 | 1/2015 | Noda et al. |
| 2017/0155036 A1* | 6/2017 | Kubota ............... H01L 41/1871 |

FOREIGN PATENT DOCUMENTS

| | | | |
|---|---|---|---|
| JP | S61-226623 A | 10/1986 | |
| JP | H06-120570 A | 4/1994 | |
| JP | H07-5036 A | 1/1995 | |
| JP | 2001-304973 A | 10/2001 | |
| JP | 2002-124708 A | 4/2002 | |
| JP | 2006317232 * | 5/2005 | ............... G01J 1/02 |
| JP | 2006-317232 A | 11/2006 | |
| JP | 2015-507739 A | 3/2015 | |
| WO | 2011/125754 A1 | 10/2011 | |
| WO | 2012/063642 A1 | 5/2012 | |

OTHER PUBLICATIONS

Schreiter M et al., "Sputtering of self-polarized PZT films for IR-detector arrays", Applications of Ferroelectrics, 1998. ISAF 98. Proceedings of the Eleventh IEEE International Symposium on Montreux, Switzerland Aug. 24-27, 1998, Piscataway, NJ, US, Aug. 24, 1998, Siemens AG, Corporate Technology, ZT MF 2, pp. 181-185, Munich, Germany.

International Search Report issued in PCT/JP2017/046480; dated Mar. 20, 2018.

International Preliminary Report on Patentability and Written Opinion issued in PCT/JP2017/046480; dated Sep. 17, 2019.

* cited by examiner

PYROELECTRIC SENSOR

CROSS-REFERENCE TO RELATED APPLICATIONS

This application is a continuation application of International Application No. PCT/JP2017/046480, filed Dec. 25, 2017, the disclosure of which is incorporated herein by reference in its entirety. Further, this application claims priority from Japanese Patent Application No. 2017-052936, filed Mar. 17, 2017, the disclosure of which is incorporated herein by reference in its entirety.

BACKGROUND OF THE INVENTION

1. Field of the Invention

The present invention relates to a pyroelectric sensor comprising a pyroelectric element used as an infrared sensor.

2. Description of the Related Art

An infrared sensor is a sensor that detects thermal radiation (infrared ray) from a measurement target.
JP2006-317232A discloses a configuration of an infrared sensor 101, as shown in FIG. 6, comprising: a silicon (Si) substrate 102; and an infrared sensing portion 103 provided on a first surface 102a of the Si substrate 102, in which a cavity portion 105 for thermal insulation is formed on the first surface 102a of the Si substrate 102 on which the infrared sensing portion 103 is positioned, and an optical filter F for transmitting only a predetermined infrared ray is provided on a second surface 102b of the Si substrate 102. In addition, an infrared absorption film 103a is provided on the infrared sensing portion 103 for improving a sensitivity. JP2006-317232A does not disclose a specific configuration of the infrared sensing portion 103 and discloses that the infrared sensing portion can be formed by using a thermopile, a thermistor, a pyroelectric element, and the like.

In JP2006-317232 does not sufficiently disclose a configuration of the infrared sensing portion and a thickness of the infrared sensing portion. However, since the infrared sensing portion is disposed on the cavity portion, a bulk element having a certain degree of rigidity in the configuration.

Not only in JP2006-317232A, but also the bulk element is used as the infrared sensing portion of the infrared sensor in the related art. As such an element, a pyroelectric element using a pyroelectric ceramic which is one kind of a piezoelectric ceramic, and a pyroelectric sensor comprising a pyroelectric element is well known as the infrared sensor. The pyroelectric element detects an infrared ray by using a pyroelectric effect in which polarization (surface charge) occurs due to a temperature change.

SUMMARY OF THE INVENTION

A pyroelectric ceramic provided in a pyroelectric sensor of the related art uses a bulk material, and accordingly, a thickness thereof is approximately equal to or greater than 1 mm. In addition, an infrared filter (optical filter) having functions of transmitting only an infrared ray at a specific wavelength of a measurement target to be detected and cutting other wavelengths, in order to prevent erroneous detection is attached to the pyroelectric sensor. Such an optical filter is generally formed with a plurality of layers on a glass plate, and accordingly, a total thickness of the glass plate is equal to or greater than 0.5 mm. Therefore, a thickness of the pyroelectric sensor (device thickness) of the related art is equal to or greater than 1.5 mm.

However, in order to mount the pyroelectric sensor on a portable terminal such as a smart phone, it is necessary to suppress a thickness of the entire sensor to be approximately equal to or smaller than 1.0 mm, and it is desired to thin the pyroelectric sensor (reduce height).

In order to realize the thinning, the use of polished pyroelectric ceramic is considered, but a polishing operation or a bonding operation of the pyroelectric ceramic having deteriorated handling properties due to the thinning by the polishing becomes difficult, and accordingly, the manufacturing becomes extremely complicated. Therefore, a sufficiently thinned pyroelectric sensor which can be applied to a thin portable terminal such as a smart phone is not realized.

An object of the invention is to provide a pyroelectric sensor capable of realizing sufficient thinning.

There is provided a pyroelectric sensor comprising: an Si substrate; a laminated portion in which a heat absorption layer formed of an inorganic material, a lower electrode, a piezoelectric film, and an upper electrode are laminated in this order from one surface side of the Si substrate on the one surface; and an optical filter that is provided at a position of the other surface of the Si substrate corresponding to the laminated portion and selectively transmits an infrared ray, in which an infrared ray incident to the laminated portion from the optical filter side through the Si substrate is sensed.

Here, the piezoelectric film is a piezoelectric body having a thickness equal to or smaller than 10 μm.

In the pyroelectric sensor of the invention, it is preferable that the lower electrode is formed of metal, and the inorganic material configuring the heat absorption layer is oxide of the metal configuring the lower electrode.

In the pyroelectric sensor of the invention, it is preferable that the inorganic material configuring the heat absorption layer is oxide of noble metal.

In the pyroelectric sensor of the invention, it is preferable that the piezoelectric film is a sputtered film.

In the pyroelectric sensor of the invention, it is preferable that a thickness of the Si substrate through which an infrared ray incident to the laminated portion is transmitted is equal to or smaller than 250 μm.

In the pyroelectric sensor of the invention, on a periphery portion of a region in which the laminated portion is provided, the Si substrate may comprise a thick portion having a thickness greater than a thickness of the region.

In the pyroelectric sensor of the invention, the Si substrate may comprise a hollow portion.

In this case, it is preferable that, in a plan view, an area of the Si substrate is greater than an area of the laminated portion, the hollow portion is superposed on the laminated portion, and the laminated portion is positioned in the region of the hollow portion.

In the pyroelectric sensor of the invention, it is preferable that the piezoelectric film is a (100) orientation film of a perovskite-type oxide.

The pyroelectric sensor of the invention includes an Si substrate, a laminated portion in which a heat absorption layer formed of an inorganic material, a lower electrode, a piezoelectric film, and an upper electrode are laminated in this order from one surface side of the Si substrate on the one surface, and an optical filter that is provided at a position of the other surface of the Si substrate corresponding to the laminated portion and selectively transmits an infrared ray, and an infrared ray incident to the laminated portion from the optical filter side through the Si substrate is sensed. The pyroelectric sensor has a configuration of comprising the laminated portion including a piezoelectric film on one surface of the Si substrate and comprising the optical filter on the other side, and accordingly, it is possible to realize the thinning Since the heat absorption layer is provided between the Si substrate and the lower electrode, it is possible to detect an infrared ray with high sensitivity.

DESCRIPTION OF THE PREFERRED EMBODIMENTS

Hereinafter, embodiments of a pyroelectric sensor of the invention will be described with reference to the drawings.

Pyroelectric Sensor of First Embodiment

Figure 1:
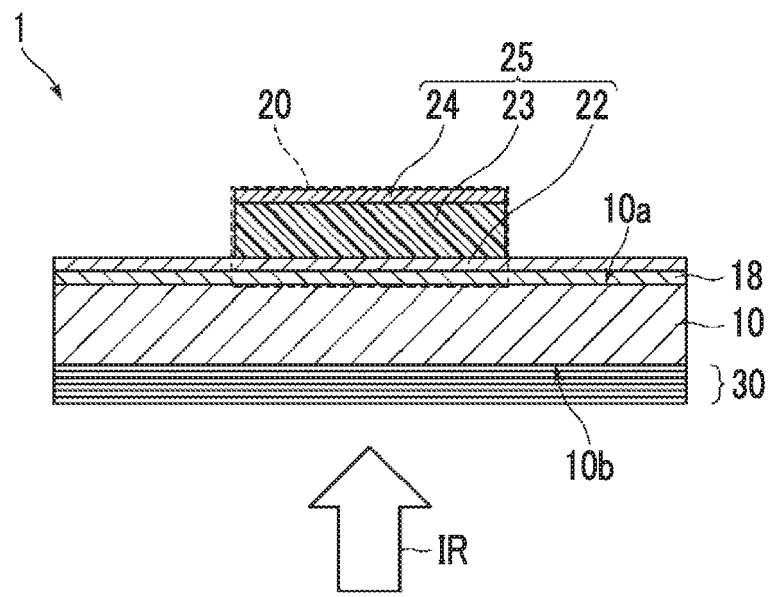
FIG. 1 is a schematic cross sectional view of a pyroelectric sensor of a first embodiment.

FIG. 1 is a schematic cross sectional view of a pyroelectric sensor 1 of a first embodiment of the invention. For the ease of recognition, a film thickness of each layer or a ratio thereof is suitably changed and does not reflect actual film thickness or ratio (the same applies to the following drawings).

A pyroelectric sensor 1 of the embodiment includes an Si substrate 10, a laminated portion 20 in which a heat absorption layer 18 formed of an inorganic material, a lower electrode 22, a (100)-oriented piezoelectric film 23, and an upper electrode 24 are laminated in this order on one surface 10a of the Si substrate 10, and an optical filter 30 that is provided at a position of the other surface 10b of the Si substrate 10 corresponding to the laminated portion 20 and selectively transmits an infrared ray, and an infrared ray IR incident to the laminated portion 20 from the optical filter 30 side through the Si substrate 10 is sensed.

Pyroelectric Sensing Portion

In the pyroelectric sensor 1, the lower electrode 22, the piezoelectric film 23, and the upper electrode 24 configure a sensing portion 25. The sensing portion 25 coincides with the laminated portion 20 in a plan view. In a case where an infrared ray is incident to the sensing portion 25, a surface charge is generated on the piezoelectric film 23 which is a piezoelectric body due to a pyroelectric effect. This surface charge is extracted through a lead wire (not shown) connected to the lower electrode 22 and the upper electrode 24 and measured as an output signal using a suitable electric circuit, and accordingly, the infrared ray can be sensed. Here, the "lower" and the "upper" does not mean the top and bottom. Regarding a pair of electrodes provided by pinching the piezoelectric film, one electrode disposed on the Si substrate 10 side is referred to as the lower electrode and the other electrode is referred to as the upper electrode.

Lower Electrode and Upper Electrode

A main component of the lower electrode 22 is not particularly limited, a material generally usable as an electrode can be suitably used, and metal is preferably used. Particularly, noble metal such as Pt, Ir, or Ru is preferable.

A main component of the upper electrode 24 is not particularly limited, an electrode material generally used in a semiconductor process such as Al, Ti, Ta, Cr, and Cu, and a combination thereof is used.

A thicknesses of the lower electrode 22 and the upper electrode 24 are not particularly limited, but, in a case where the thickness is extremely small, a resistance value increases and a function of the electrodes is deteriorated. In a case where the thickness is great, adhesiveness or heat capacity increases. Accordingly, thickness of both the electrodes 22 and 24 is preferably 50 nm to 300 nm.

Piezoelectric Film

The piezoelectric film 23 is preferably formed of one kind or a plural kinds of perovskite-type oxides represented by General Formula (P).

General Formula $ABO_3$ (P)

(In General Formula P, A: an element on the A site, at least one kind of element selected from the group consisting of Pb, Ba, La, Sr, Bi, Li, Na, Ca, Cd, Mg, and K, B: an element on the B site, at least one kind of element selected from the group consisting of Ti Zr, V, Nb, Ta, Cr, Mo, W, Mn, Sc, Co, Cu, In, Sn, Ga, Zn, Cd, Fe, and Ni, O: an oxygen atom, a case where a mol number of the A site element is 1.0 and a mol number of the B site element is 1.0 is a standard, but the mol numbers of the A site element and the B site element may be deviated from 1.0 within a range for obtaining a perovskite structure.)

Examples of the perovskite-type oxide represented by the general formula described above include a lead-containing compound such as lead titanate, lead zirconate titanate (PZT), lead zirconate, lead lanthanum titanate, lead zirconate titanate lanthanum, magnesium niobate lead zirconium titanate, nickel lead niobate zirconium titanate, or zinc niobate lead zirconium titanate, and crystals of these; a lead-free compound such as barium titanate, strontium barium titanate, bismuth sodium titanate, bismuth potassium titanate, sodium niobate, potassium niobate, lithium niobate, bismuth ferrite, and crystals of these.

In addition, the piezoelectric film 23 more preferably includes one kind or two or more kinds of perovskite-type oxides represented by General Formula PX.

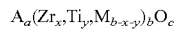

$A_a(Zr_x,Ti_y,M_{b-x-y})_bO_c$ (PX)

(In General Formula (PX), A is an element on an A site and at least one element including Pb, and M is at least one element selected from the group consisting of V, Nb, Ta, and Sb. A case where $0<x<b$, $0<y<b$, $0\leq b-x-y$, and $a:b:c=1:1:3$ are standard, and the molar ratio thereof may be deviated from the standard molar ratio within a range for obtaining a perovskite structure.)

The perovskite-type oxide (PX) is intrinsic PZT or PZT in which a part of B site is substituted with M. It is known that, in PZT to which various donor ions having a valence higher than a valence of a substitutable ion are added, properties such as piezoelectric performance are improved than the intrinsic PZT. M is preferably one kind or two or more kinds of donor ion having a valence greater than those of tetravalent Zr and Ti. Examples of such a donor ion include $V^{5+}$, $Nb^{5+}$, $Ta^{5+}$, $Sb^{5+}$, $Mo_{6+}$, $W_{6+}$.

b-x-y is not particularly limited, as long as it is in a range for obtaining a perovskite structure. For example, in a case where M is Nb, a molar ratio of Nb/(Zr+Ti+Nb) is preferably 0.05 to 0.25 and more preferably 0.06 to 0.20.

Not only a lead-based perovskite-type piezoelectric material, but also a lead-free perovskite-type piezoelectric material (for example, (K, Na)NbO$_3$ can be suitably used. In addition, for the piezoelectric film of the pyroelectric element of the invention, not only a piezoelectric material formed of a perovskite-type oxide, but any materials may be used, as long as it is a piezoelectric material capable of forming a thin film.

The piezoelectric film 23 is preferably a columnar structural film formed of a plurality of columnar crystal substances extending in a non-parallel direction with respect to a substrate surface. This is because a high piezoelectric performance is obtained. In the film structure formed of a plurality of columnar crystals extending in the non-parallel direction with respect to the substrate surface, an orientation film along crystal orientations is obtained. By forming a PZT-based piezoelectric film by or vapor phase growth sol gel at a substrate temperature equal to or higher than 500° C., it is possible to obtain a (100) orientation film having a perovskite structure. It is preferable to obtain the orientation film by the film formation, because a polarization process is not necessary. A growth direction of the columnar crystal may not be parallel to the substrate surface, and may be an approximately vertical direction or an oblique direction. An average column diameter of a plurality of the columnar crystals forming the piezoelectric film is not particularly limited, and is preferably 30 nm to 1 µm.

The (100) orientation film means a film having a perovskite structure preferred-oriented to the (100) plane. The preferred orientation is a state where the orientation directions of the crystals are not disordered and a specific crystal surface is oriented substantially in a certain direction. Specifically, the expression "preferred-oriented to the (100) plane" means a ratio (100)/((100)+(110)+(111)) of a diffracted intensity of the (100) plane, (110) plane, and (111) plane generated in a case of performing the measurement regarding the piezoelectric film by an X-ray diffraction wide-angle method is greater than 0.5.

A film thickness of the piezoelectric film 23 is not particularly limited, as long as it is equal to or smaller than 10 µm, and the film thickness thereof is normally equal to or greater than 1 µm, for example, 1 to 5 µm. The piezoelectric film having a film thickness equal to or smaller than 10 µm is used, and accordingly, size reduction particularly in a thickness direction and height reduction of the entire pyroelectric sensor can be realized, compared to the pyroelectric sensor using a bulk piezoelectric body of the related art.

Si Substrate

It is preferable that a thickness of the Si substrate 10 is thin. It is because that, as the thickness is small, heat capacity is small, and response is high. Specifically, the thickness thereof is preferably equal to or smaller than 600 µm, more preferably equal to or smaller than 400 µm, and particularly preferably equal to or smaller than 250 µm. Meanwhile, in a case of using a plate-shaped substrate as in the embodiment, in order to prevent a warp due to a stress in a case of forming a piezoelectric film, the thickness is preferably equal to or greater than 100 µm and more preferably equal to or greater than 200 µm. The Si substrate 10 may include a stress adjustment layer.

It is necessary that the Si substrate 10 transmits an infrared ray. Accordingly, as the Si substrate 10, a substrate with less doped impurities, that is, a wafer having a high resistivity is preferably used. Specifically, the Si substrate preferably has a volume resistivity equal to or greater than 10 Ωcm and more preferably equal to or greater than 100 Ωcm.

In order to form the optical filter 30 having high sensitivity, at least the other surface 10b of the Si substrate 10 is mirror-polished, and a surface roughness Ra is preferably equal to or smaller than 1 nm.

Heat Absorption Layer

The heat absorption layer 18 absorbs an infrared ray (heat) and efficiently transfers heat to the sensing portion 25. By including this heat absorption layer 18, it is possible to improve sensing sensitivity. In a case where the heat absorption layer 18 is not included and the lower electrode 22 is a metal electrode such as Ir or Pt, the heat is not efficiently transferred to the sensing portion 25 due to reflection of the infrared ray IR by the metal electrode, and the performance may not be sufficiently exhibited.

The heat absorption layer 18 is configured of an inorganic black material. As a general heat absorption layer, a black absorber layer formed of an organic material including a colorant is well known, and the organic material has low heat resistance. In the pyroelectric sensor of the invention, the heat absorption layer is configured of an inorganic material having high heat resistance.

For the configuration of the pyroelectric sensor 1, it is necessary to form the heat absorption layer 18 on the substrate before the piezoelectric film 23, and the film formation step of the piezoelectric film 23 is the post step. A treatment at a high temperature cannot be performed with respect to the heat absorption layer having low heat resistance formed of an organic material, in the film formation step of the piezoelectric film 23. In the invention, the inorganic material having high heat resistance is used in the heat absorption layer, and accordingly, the film formation step of the piezoelectric film to be exposed to a temperature equal to or higher than 500° C. can be performed, and a degree of freedom of the manufacturing is high.

As the heat absorption layer 18, it is preferable to use a material having black oxide among the metal capable of being applied to the lower electrode 22 described above. The oxide of noble metal is preferable, due to high adhesiveness with Si which is a substrate material and the heat resistance. Specifically, PtOx, IrOx, or RuO is preferable.

It is preferable that the heat absorption layer 18 and the lower electrode 22 are seamlessly formed, from a viewpoint of adhesiveness. The metal configuring the lower electrode 22 and the metal of the metal oxide configuring the heat absorption layer 18 are set to be the same and the film formation is continuously performed, and accordingly, the heat absorption layer 18 and the lower electrode 22 can be seamlessly formed. For example, in a case where the lower electrode 22 is formed of Ir, an IrOx film is formed by reactive sputtering using Ir as a target while flowing mixed gas of O$_2$ and Ar as film formation gas in vapor phase film formation such as sputtering. The flowing of O$_2$ is stopped during the sputtering, and accordingly, the amount of oxygen introduced into the film slowly decreases, a film of only Ir can be formed followed by the IrOx film, and the IrOx film and the Ir film can be seamlessly formed. At this time, a boundary between the IrOx film and the Ir film is not clear and a region where the content of O slowly decreases is obtained.

The thickness of the heat absorption layer 18 is preferably equal to or greater than 1 nm, from a viewpoint of efficiently absorbing the infrared ray. In addition, from viewpoints of maintaining excellent adhesiveness and the setting heat capacity not to be extremely great, the thickness is preferably equal to or smaller than 100 nm.

Optical Filter

The optical filter 30 is an infrared filter which cuts an infrared ray other than the detection target which becomes a noise source as many as possible, and transmits infrared ray at a wavelength which is the detection target. As the optical filter, a multilayer film filter of an inorganic material may be used, or a coating type filter of an organic material may be used. In order to form a filter having excellent performance, a surface roughness Ra of the film formation surface of the optical filter is preferably equal to or smaller than 1 nm. Accordingly, it is preferable to use an Si wafer subjected to rear surface polishing.

A transmission wavelength of the optical filter 30 can be selected by the desired detection target. In a case of using as a motion detector, usage of a band-pass filter which transmits only an infrared ray at a wavelength of approximately 9 to 10 μm corresponding to the infrared ray generated from a human body is ideal. However, a wavelength range for occurring erroneous detection may be removed, and from a viewpoint of cost or the like, a well-known long-pass filter which transmits an infrared ray at a wavelength higher than 5 μm (cuts the infrared ray at a wavelength equal to or lower than 5 μm) may be used.

Manufacturing Method

An example of a manufacturing method of the pyroelectric sensor 1 of the first embodiment will be described.

A both-sided polished Si wafer (for example, thickness of 250 μm) is used as the Si substrate 10. On the Si wafer, a thermal oxidation film may or may not be formed.

First, the heat absorption layer 18 and the lower electrode 22 are formed on the Si substrate 10 by a sputtering method. For example, the IrOx film is seamlessly formed as the heat absorption layer 18 and the Ir film is seamlessly formed as the lower electrode 22. For example, Ar+30% $O_2$ gas flows as a film formation gas by using Ir as a target, to form an IrOx film to have a thickness of approximately 10 nm by reactive sputtering. While not setting the plasma of the sputtering as OFF, the content of $O_2$ in the film formation gas is set as 0%, the sputtering is continued only with Ar, and an Ir film having a thickness of approximately 150 nm is formed. IN order to improve adhesiveness between IrOx and the Si substrate, an adhesive layer such as Ti having a thickness equal to or smaller than several nm may be formed on the Si substrate, before forming the film of IrOx. Here, setting the thickness of the adhesive layer to be equal to or smaller than several nm is because, in a case where the thickness is extremely great, the function of IrOx as the heat absorption layer decreases.

Next, the piezoelectric film 23 is formed on the lower electrode 22. For example, the substrate is heated to a temperature for crystallizing PZT (500° C. to 650° C.), and the PZT film is formed as the piezoelectric film 23. As described above, in a case where the substrate temperature is set as a high temperature equal to or higher than 500° C. and the heat absorption layer formed of an organic material is included, thermal damage occurs and the function as the heat absorption layer is not exhibited. In the invention, the inorganic material having high heat resistance is used in the heat absorption layer, and accordingly, the heat absorption layer effectively functions, even after such a high temperature treatment.

A part of the obtained piezoelectric film 23 is etched and patterned, and the upper electrode 24 is formed on the piezoelectric film 23.

Then, the optical filter 30 is formed on the other surface 10b of the Si substrate 10. The optical filter 30 can be, for example, formed by vapor deposition. Alternatively, the optical filter may be formed by applying an absorber of an organic material to the other surface 10b of the Si substrate 10.

By performing the above steps, it is possible to manufacture the pyroelectric sensor 1 of the first embodiment.

The pyroelectric sensor 1 having this configuration includes a piezoelectric film having a thickness equal to or smaller than 10 μm on the sensing portion 25, instead of the bulk piezoelectric body of the related art, the sensing portion 25 on one surface of one substrate, and the optical filter 30 on the other surface thereof. Accordingly, it is possible to decrease the thickness of the entire sensor and to realize a height-reduced pyroelectric sensor in which the thickness of the entire sensor is suppressed to be equal to or smaller than 1 mm.

Pyroelectric Sensor of Second Embodiment

Figure 2:
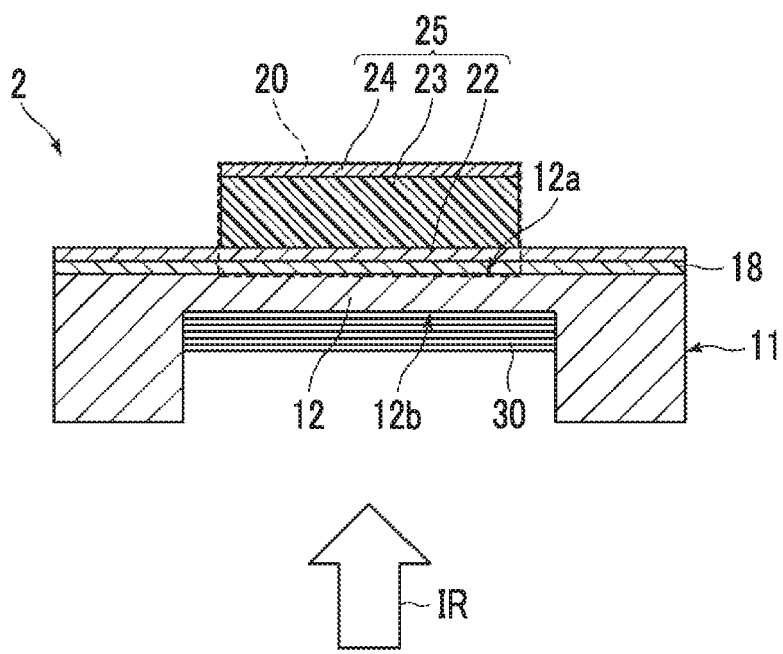
FIG. 2 is a schematic cross sectional view of a pyroelectric sensor of a second embodiment.

FIG. 2 is a schematic cross sectional view of a pyroelectric sensor 2 of a second embodiment. The same reference numerals are used for the same constituent elements as those of the pyroelectric sensor shown in FIG. 1, and the specific description thereof is omitted (the same applies to the following drawings).

The pyroelectric sensor 2 of this embodiment comprises an Si substrate 11 having a diaphragm structure, instead of the plate-shaped Si substrate 10 of the first embodiment. The laminated portion 20 (sensing portion 25) is provided on one surface 12a of a diaphragm 12 and the optical filter 30 is provided on the other surface 12b of the diaphragm 12. That is, the Si substrate 11 having a diaphragm structure including a diaphragm support formed of a thick portion having a thickness greater than the thickness of the diaphragm 12 on the periphery portion of the diaphragm 12, on which the laminated portion 20 is provided, is used.

In a case of using the Si substrate 11 of this embodiment, the thickness of the Si portion through which the infrared ray IR incident to the sensing portion 25 is transmitted can be decreased. As the portion of the Si substrate through which the infrared ray is transmitted is thin, it is possible to decrease heat capacity and improve a response performance as the sensor.

As described above, the thickness of the Si substrate through which the infrared ray IR incident to the sensing portion 25 is transmitted is preferably equal to or smaller than 250 μm. Meanwhile, in a case where the entire Si substrate is thin, handling ability decreases. According to this configuration, it is possible to improve the response by decreasing the thickness of the portion where the sensing portion 25 is provided, and to realize excellent handling ability by including the thick portion on the periphery. The thickness of the diaphragm 12 is preferably equal to or smaller than 200 µm, more preferably equal to or smaller than 100 µm, and even more preferably equal to or smaller than 50 µm.

As described above, the pyroelectric sensor 2 of the second embodiment can further improve the response, in addition to the effect obtained by the pyroelectric sensor 1 of the first embodiment.

Pyroelectric Sensor of Third Embodiment

Figure 3:
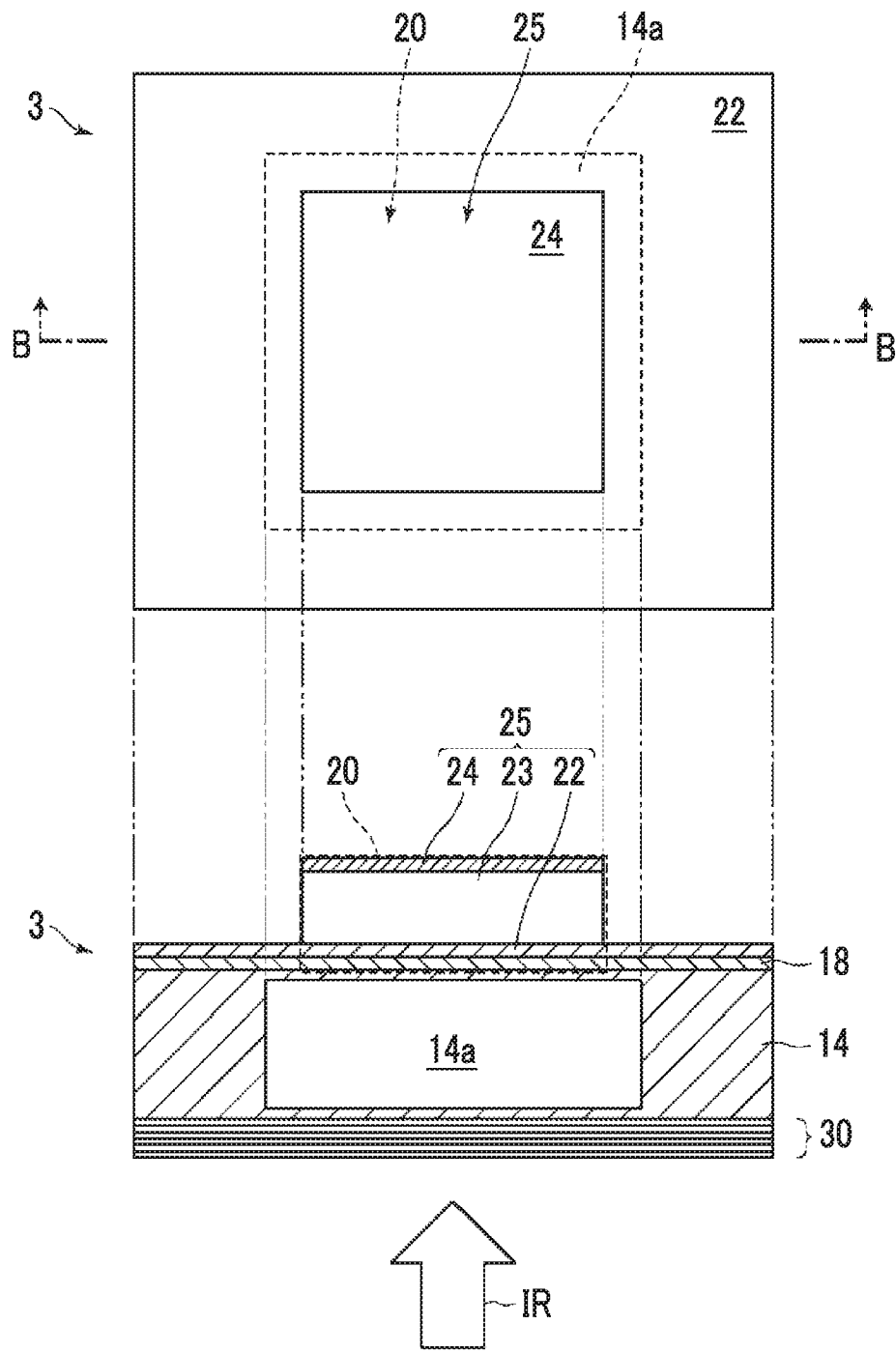
FIG. 3 is a schematic plan view and a schematic cross sectional view of a pyroelectric sensor of a third embodiment.

FIG. 3 is a schematic plan view and a B-B line schematic cross sectional view of a pyroelectric sensor 3 of a third embodiment.

The pyroelectric sensor 3 of the third embodiment includes an Si substrate 14 having a hollow portion 14a, instead of the Si substrate 10 of the pyroelectric sensor 1 of the first embodiment. The laminated portion 20 is provided on the hollow portion 14a, not over the entire surface of the Si substrate 14. As shown in the schematic plan view of FIG. 3, in plan view, the area of the Si substrate 14 is greater than the area of the laminated portion (sensing portion 25), the laminated portion 20 is provided to be superposed on the hollow portion 14a, and the laminated portion 20 is provided in a region smaller than the hollow portion 14a in the region of the hollow portion 14a.

The hollow portion 14a is preferably in a vacuum state or has reduced pressure and is more preferably in a vacuum state. This is because, as the state thereof is closer to a vacuum state, the effect due to air is hardly received, and noise can be prevented.

The Si substrate 14 includes the hollow portion 14a, and accordingly, the infrared ray IR incident to the optical filter 30 is transmitted through the hollow portion 14a and arrives the heat absorption layer 18. An actual portion of the Si substrate 14 through which the infrared ray IR incident to the optical filter 30 is transmitted, is only a thin layer on front and rear surface configuring the hollow portion 14a, and accordingly, the sensing with high responsibility can be performed.

In the pyroelectric sensor 3 of this embodiment, the response can be further improved, in addition to the effect obtained by the pyroelectric sensor 1 of the first embodiment. In addition, the handling ability further increases than that of the pyroelectric sensor 2 of the second embodiment including the substrate having a diaphragm structure. Since the entire surface forming the optical filter 30 is a flat surface, the film formation of the optical filter 30 is easier than a case of the pyroelectric sensor 2, and it is possible to form the optical filter 30 having a high accuracy.

The substrate 14 including the hollow portion 14a can be manufactured as follows, for example. Two silicon on insulator (SOI) wafers are prepared, one SOI wafer is dug by reactive ion etching (RIE), and a recess is formed. The other SOI wafer is attached so as to cover the recess of the SOI wafer described above. After that, by polishing and/or etching the surface, it is possible to manufacture a cavity SOI wafer (substrate including a hollow portion).

Image Sensor

Figure 4:
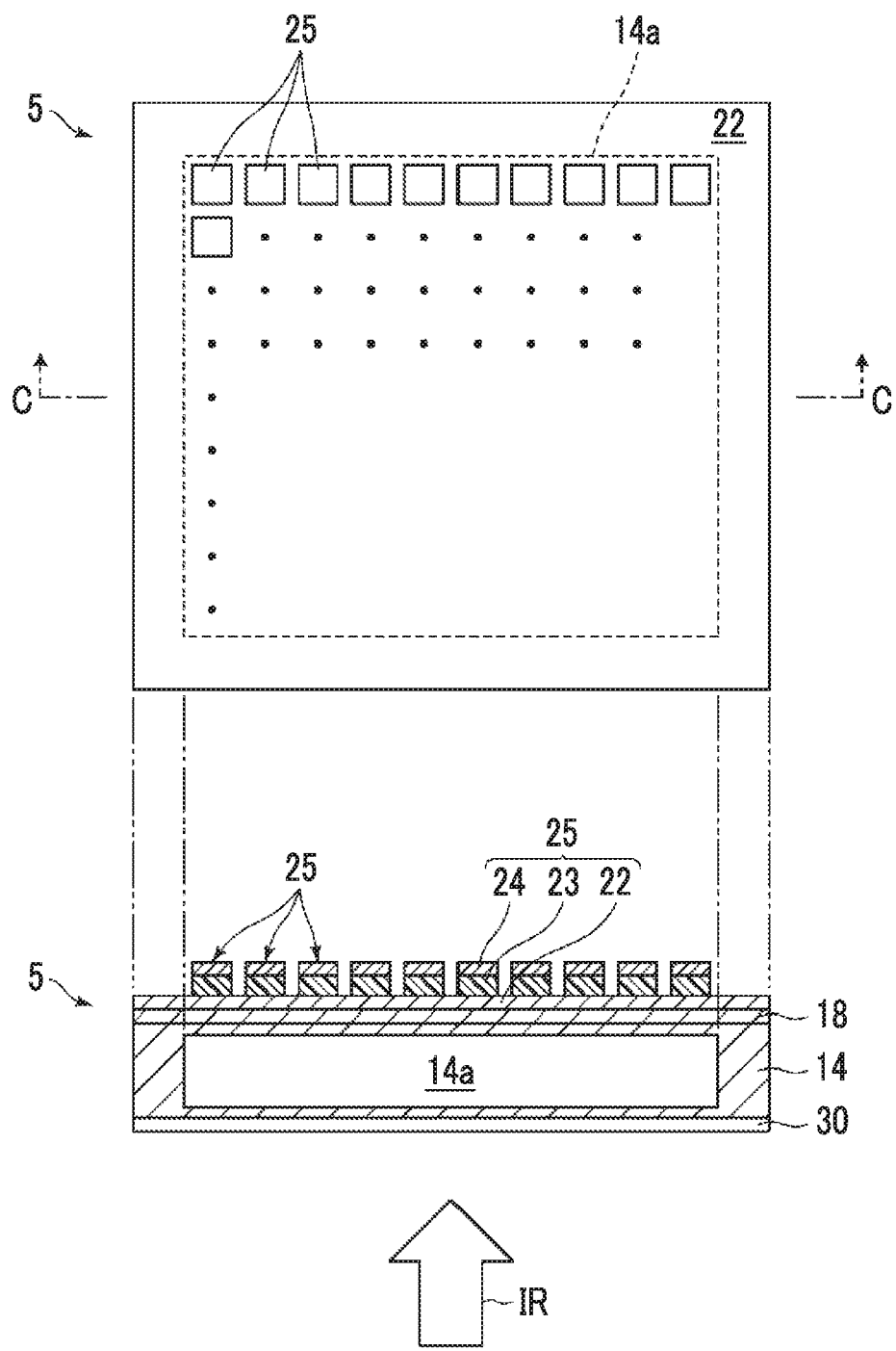
FIG. 4 is a plan view and a cross sectional view showing a schematic configuration of an image sensor in which pyroelectric sensors are arranged in an array shape.

Such pyroelectric sensors are arranged and formed in an array shape and can be used as an image sensor. FIG. 4 is a plan view and a C-C line cross sectional view showing a schematic configuration of an example of an image sensor including pyroelectric sensors which are arranged in an array shape.

An image sensor 5 includes the heat absorption layer 18 on one surface of the Si substrate 14 including the hollow portion 14a, and a plurality of sensing portions 25, each of which is formed by laminating the lower electrode 22, the piezoelectric film 23, and the upper electrode 24 are vertically and horizontally arranged on the heat absorption layer 18. The lower electrodes 22 are uniform common electrode common to the sensing portions 25. Meanwhile, the piezoelectric film 23 and the upper electrode 24 are patterned and separated for each sensing portion 25. In addition, the image sensor 5 includes the optical filter 30 over the entire other surface of the Si substrate 14.

The image sensor 5 includes a plurality of the same pyroelectric sensors as that in the third embodiment and the thickness is also the same, and accordingly, a height-reduced device can be configured as the image sensor 5.

EXAMPLES

Hereinafter, the effects will be described with reference to specific examples and comparative examples of the pyroelectric sensor of the invention.

Example 1

A both-side polished Si wafer having a thickness of 250 µm was used as the Si substrate. As the Si substrate, a substrate having a small doped amount and a great volume resistance equal to or greater than 100 Ωcm was used in order to transmit an infrared ray.

On the Si wafer, a thermal oxidation film may or may not be formed. Then, regarding a heat absorption layer, an iridium oxide film (IrOx film) was formed on the Si substrate by sputtering method, heating the substrate to 300° C., to have a thickness of approximately 10 nm with a composition of Ar+30% $O_2$ gas. After that, while not setting the plasma of the sputtering as OFF, the content of oxygen in the film formation gas was set as 0%, the sputtering was performed only with Ar, and Ir electrode was formed to have a thickness of approximately 150 nm as the lower electrode. Accordingly, the film of Ir was seamlessly formed from IrOx with excellent adhesiveness.

Next, in a state where the substrate was heated to 550° C., a piezoelectric film was formed on the Ir electrode to have a thickness of 3 µm. Regarding the film formation gas, gas having a composition of $Pb_{1.3}(Zr_{0.52}Ti_{0.48})_{0.88}Nb_{0.12})O_3$ as a target material using the mixed gas of 97.5% Ar+2.5% $O_2$ was used.

A part of the obtained piezoelectric film (hereinafter, referred to as Nb-PZT film) was etched and patterned, Ir was formed on the Nb-PZT film as the upper electrode, and a pyroelectric sensor of Example 1 was obtained.

IN the invention, the optical filter is provided on the other surface of the Si substrate, but here, the evaluation was performed in a state where the optical filter is not included. The same applies to the following examples and comparative examples. The presence or absence of the optical filter does not directly affect a responding speed of the response and sensitivity with respect to an infrared ray at a specific wavelength, and does not affect the evaluation of the effect of the invention.

As described above in the examples, the optical filter is not included on a rear surface of the Si substrate, but in a case where a typical optical filter (thickness of approximately 7 µm) was formed by direct vapor deposition on the rear surface of the Si substrate, it is possible to manufacture a coating type pyroelectric sensor having a total thickness of approximately 270 μm including the thickness of the optical filter. In a case of setting this thickness, a total thickness equal to or smaller than 1 mm including the package can be achieved without any problems.

As in the related art, in a case where the optical filter is formed and provided on quartz glass having a thickness of 0.5 mm, a total thickness of the pyroelectric sensor is equal to or greater than 0.85 mm, the thickness including the package exceeds 1.0 mm, and this is difficult to apply an electronic device having a height limit.

Comparative Example 1

A pyroelectric sensor having a configuration not including the heat absorption layer in the pyroelectric sensor of Example 1 was manufactured as Comparative Example 1. A manufacturing step except that the heat absorption layer is not formed, is the same as in Example 1.

In Example 1 and Comparative Example 1, the evaluation was performed as the pyroelectric sensor.

A pyroelectric current and responsibility, in a case where a sensor was installed in a room at a room temperature of 25° C. and a heat source at 70° C. was installed at a distance of 100 mm, were examined.

Regarding the sensor of Example 1, the pyroelectric current of 35 nA was observed after approximately 10 seconds from the heat source installation. On the other hand, regarding the sensor of Comparative Example 1 in which the heat absorption layer was not included, a pyroelectric current of 3 nA was observed after approximately 10 seconds from the heat source installation. That is, it was confirmed that, the sensitivity greatly varied depending on the presence or absence of the heat absorption layer, and high sensitivity was obtained by including the heat absorption layer.

The same measurement was performed regarding the pyroelectric sensor including a piezoelectric body of a bulk material in a sensing portion of the related art, a great pyroelectric current was observed after 20 seconds from the heat source installation, and it was confirmed that excellent responsibility was obtained in the sensor of the example, compared to that in the related art.

Example 2

Figure 5:
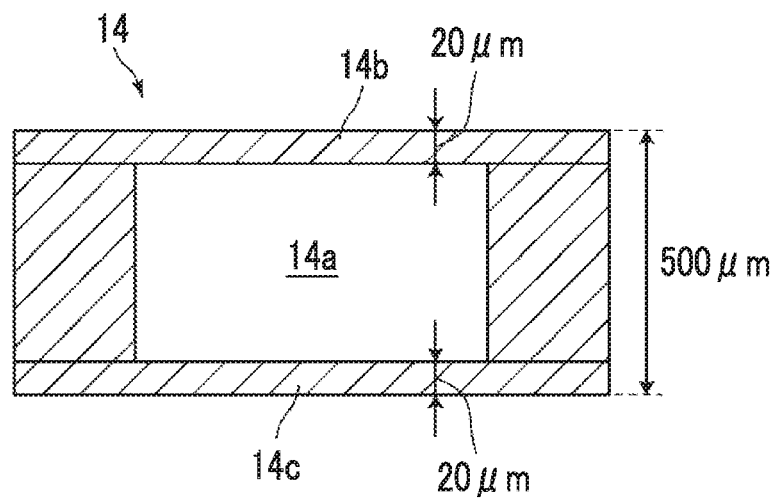
FIG. 5 is a schematic cross sectional view showing a substrate used in Example 2.
Figure 6:
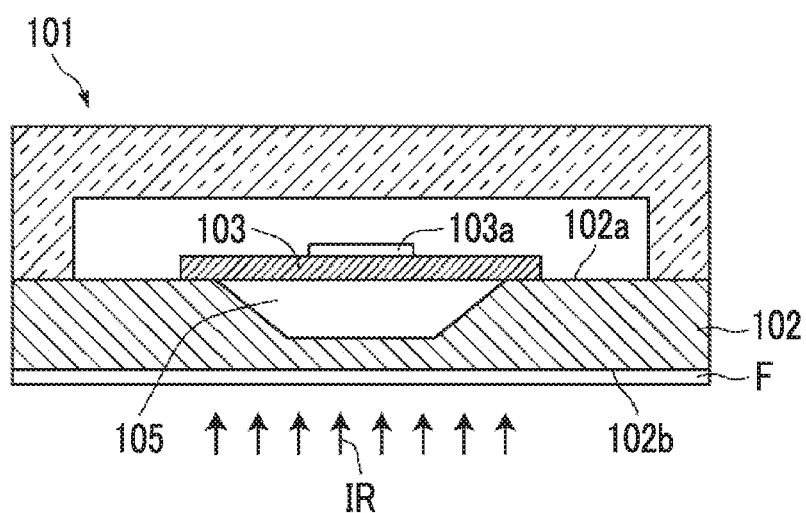
FIG. 6 is a cross sectional view of an infrared sensor of the related art.

Instead of the plate-shaped Si substrate in Example 1, a cavity wafer including a hollow portion in which a pressure was reduced was used as a substrate. As the substrate 14, as shown in FIG. 5, a substrate in which a hollow portion 14a is provided in an Si wafer and thicknesses of an upper layer 14b and a lower layer 14c surrounding the hollow portion 14a were respectively 20 μm, and a thickness of the wafer was 500 μm was used.

A pyroelectric sensor of Example 2 was manufactured by the same manufacturing step as in Example 1, except the substrate. In a case of patterning the piezoelectric film, as shown in FIG. 3, the sensing portion 25 was formed in a region narrower than the hollow portion 14a in the region of the hollow portion 14a.

By doing so, the pyroelectric sensor of Example 2 was manufactured. In this example, the optical filter is not included, but in a case where the optical filter (thickness of approximately 7 μm) was formed by direct vapor deposition on the rear surface of the substrate, it is possible to manufacture a sensor having a total thickness of approximately equal to or smaller than 510 μm.

Example 3

A pyroelectric sensor was manufactured by the same manufacturing step as in Example 1, by using the same cavity wafer as in Example 2 as the substrate. However, the patterning of the piezoelectric film was not performed, and the sensing portion is included on the entire surface of the substrate.

In Example 2 and Example 3, the pyroelectric current and responsibility were evaluated by the same method as in Example 1 and Comparative Example 1.

Regarding the pyroelectric sensor of Example 2, the pyroelectric current of 35 nA was observed after approximately 1 second from the heat source installation, and extremely excellent responsibility was obtained. Regarding the pyroelectric sensor of Example 3, a peak value of the pyroelectric current was obtained after approximately 1.5 seconds, and the responsibility was slightly deteriorated, compared to the pyroelectric sensor of Example 2.

It is thought that the thickness of the substrate through which the infrared ray incident to the sensing portion is transmitted is thinner than that in Example 1, and accordingly, heat capacity decreases and responsibility is improved. In addition, it is thought that, in a case where the sensing portion is provided over the entire surface, the effect of heat of the substrate is easily received and the responsibility is relatively decreased, compared to a case of including the sensing portion only on the hollow portion.

EXPLANATION OF REFERENCES

1, 2, 3: pyroelectric sensor
5: image sensor
10: Si substrate
10a: one surface of Si substrate
10b: the other surface of Si substrate
11: Si substrate
12: diaphragm
12a: one surface of diaphragm
12b: the other surface of diaphragm
14: Si substrate
14a: hollow portion
18: heat absorption layer
20: laminated portion
22: lower electrode
23: piezoelectric film
24: upper electrode
25: sensing portion
30: optical filter
101: infrared sensor
102: Si substrate
102a: first surface
102b: second surface
103: infrared sensing portion
103a: infrared absorption film
105: cavity portion

What is claimed is:

1. A pyroelectric sensor comprising:
   an Si substrate;
   a laminated portion in which a heat absorption layer formed of an inorganic material, a lower electrode formed of metal, a piezoelectric film, and an upper electrode are laminated in this order from one surface side of the Si substrate on the one surface; and
   an optical filter that is provided at a position of the other surface of the Si substrate corresponding to the laminated portion and selectively transmits an infrared ray,
   wherein an infrared ray incident to the laminated portion from the optical filter side through the Si substrate is sensed, the inorganic material is an oxide of the metal that forms the lower electrode, and the metal that forms the lower electrode is a metal having an oxide that is black.

2. The pyroelectric sensor according to claim 1, wherein the inorganic material is oxide of noble metal.

3. The pyroelectric sensor according to claim 1, wherein the piezoelectric film is a sputtered film.

4. The pyroelectric sensor according to claim 1, wherein a thickness of the Si substrate through which an infrared ray incident to the laminated portion is transmitted is equal to or smaller than 250 µm.

5. The pyroelectric sensor according to claim 1, wherein, on a periphery portion of a region in which the laminated portion is provided, the Si substrate includes a thick portion having a thickness greater than a thickness of the region.

6. The pyroelectric sensor according to claim 1, wherein the Si substrate includes a hollow portion.

7. The pyroelectric sensor according to claim 6, wherein, in a plan view, an area of the Si substrate is greater than an area of the laminated portion, the hollow portion is superposed on the laminated portion, and the laminated portion is positioned in the region of the hollow portion.

8. The pyroelectric sensor according to claim 1, wherein the piezoelectric film is a (100) orientation film of a perovskite-type oxide.

9. The pyroelectric sensor according to claim 1, wherein the metal is Pt, Ir, or Ru.

10. The pyroelectric sensor according to claim 1, wherein the heat absorption layer and the lower electrode are seamlessly formed such that a boundary between the heat absorption layer and the lower electrode is a region at which the content of O slowly decreases.

* * * * *